United States Patent [19]

Bailey et al.

[11] Patent Number: 5,206,769
[45] Date of Patent: Apr. 27, 1993

[54] METHOD FOR CONTROLLING A PLURALITY OF PHASE-LOCK LOOPS FROM A COMMON FREQUENCY CONTROL

[75] Inventors: James A. Bailey; Gary F. Gooding, both of Tucson, Ariz.

[73] Assignee: International Business Machines Corporation, Armonk, N.Y.

[21] Appl. No.: 862,919

[22] Filed: Apr. 6, 1992

Related U.S. Application Data

[62] Division of Ser. No. 511,688, Apr. 20, 1990, Pat. No. 5,138,282.

[51] Int. Cl.$^5$ .......................... G11B 5/09; H03L 7/07; H03L 7/093
[52] U.S. Cl. ......................................... 360/51; 331/2; 331/17; 331/46; 360/30
[58] Field of Search .......................... 360/30, 37.1, 51; 331/2, 17, 25, 46

[56] References Cited

U.S. PATENT DOCUMENTS

| | | | |
|---|---|---|---|
| 4,433,424 | 2/1984 | Taber et al. | 375/106 |
| 4,470,082 | 9/1984 | Van Pelt et al. | 360/51 |
| 4,825,321 | 4/1989 | Hassel et al. | 360/51 |

FOREIGN PATENT DOCUMENTS 3863058 8/1988 Austria .
59-195310 11/1984 Japan .
60-201577 10/1985 Japan .
62-234476 10/1987 Japan ................................. 360/51
1531632 11/1978 United Kingdom .

OTHER PUBLICATIONS

IBM Technical Disclosure Bulletin vol. 14 No. 3 p. 726 "Frequency Sychronization of Dead Tracked VFC's" Aug. 1971.

Primary Examiner—Siegfried H. Grimm
Attorney, Agent, or Firm—H. F. Somermeyer; H. St. Julian

[57] ABSTRACT

In a magnetic tape readback system for a multi-track tape player, a phase lock loop is provided for each of the channel circuits used for reading signals from the respective tracks on a multi-track tape. A common frequency determining capacitor is coupled to all of the phase lock loops such that the frequency of operation of the phase lock loops is stabilized. The capacitor has a capacitance usable in the individual phase lock loops for determining a frequency of operation and it is commonly AC connected to all of the phase lock loops. A capacitance AC couples and DC blocks each of the individual phase lock loops to the frequency determining capacitor such that the individual phase lock loops have their own reference DC levels and yet receive AC input from all of the other phase lock loops.

6 Claims, 1 Drawing Sheet

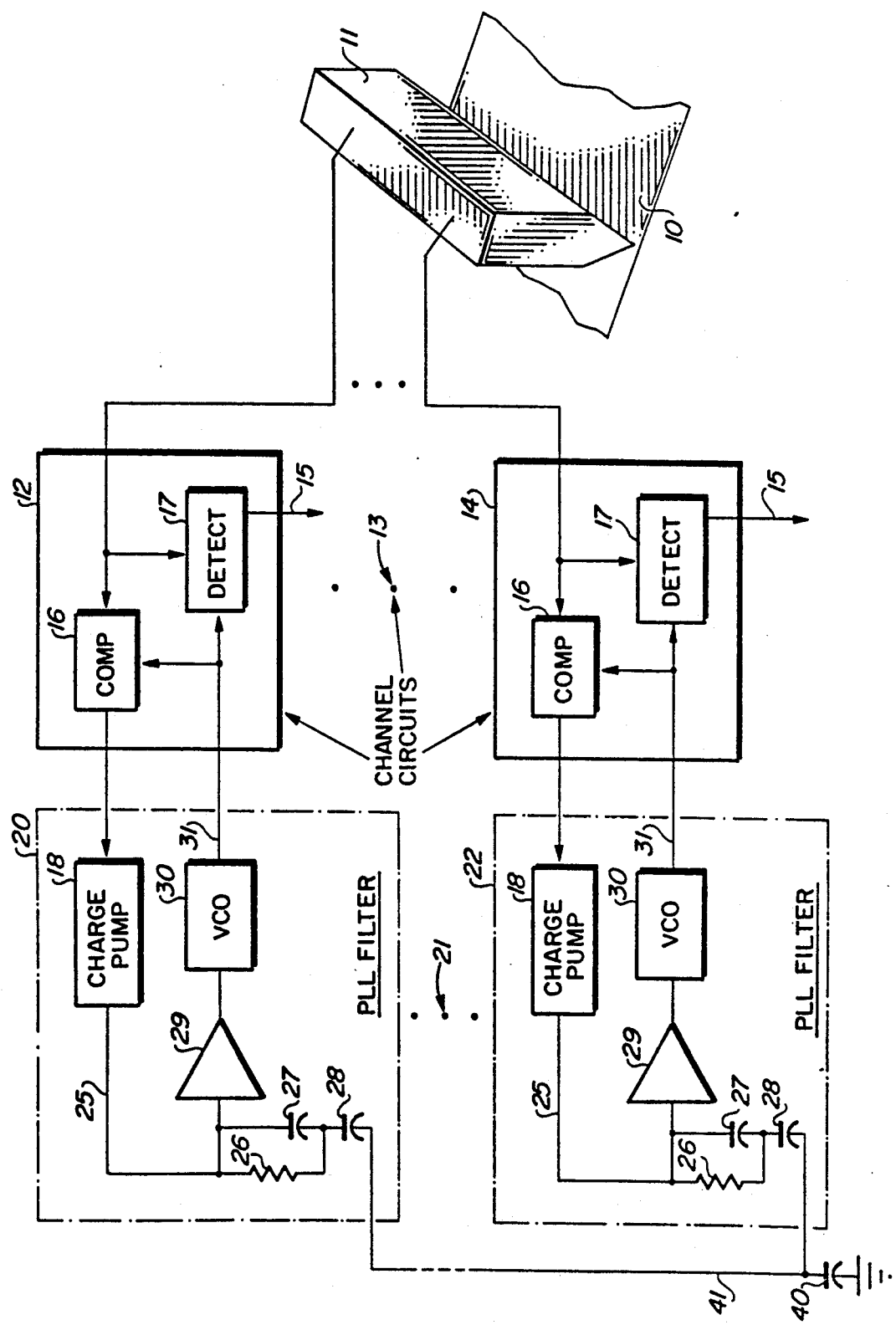

METHOD FOR CONTROLLING A PLURALITY OF PHASE-LOCK LOOPS FROM A COMMON FREQUENCY CONTROL

RELATED APPLICATION

This application is a division of Ser. No. 07/511,688, filed Apr. 20, 1990 now U.S. Pat. No. 5,138,282.

FIELD OF THE INVENTION

The present invention relates to timing or clocking circuits which are particularly useful for multi-track recording systems, such as, magnetic tape recorders.

BACKGROUND OF THE INVENTION

The present invention relates to timing or clocking systems wherein the clocking systems are useful for recovering data signals recorded on a record member. All of the tracks of the record member are simultaneously read but independently timed. When certain error inducing situations occur, such as signal drop out, it is desired to have the clock recover as quickly as possible and to maintain its frequency of operation throughout a defect area. In particular, steps have been tried to improve so called clock recovery i.e., generate timing signals based upon the signals being sensed in a multi-tracked system. In such systems, it is desired to reduce average error lengths, enhance clock recovery after a defect, improve immunity to synchronization loss events, improve accelerating tracking capability of the record medium, improve signal to noise ratio in the signal recovery channel, and eliminate high gain loop modes. All of these improvements relate to independent phase lock loops (PLLs) currently used in multi-track and magnetic tape systems.

DISCUSSION OF THE PRIOR ART

The problems associated with clock timing losses i.e., the PLLs become out of synchronization (sync) with the data signals being recovered, is that it prevents the faithful reproduction of the recorded data. This problem continues to be a paramount problem. Many early and current multi-track tape systems, when such clock synchronization is lost in a track, abort reading that particular track. This read aborting action is referred to as "dead tracking." Re-synchronization bursts are provided for enabling the dead tracked PLL to again become synchronized to signals being received from the record member; then ensuing signals may be successfully read. This recovery of phase and frequency sync can pose a problem if the dead tracked PLL shifts its frequency far from the desired or readback frequency. An attempt for enhancing recovery of the PLL operation to the signals being read off the record member is shown in the IBM Technical Disclosure Bulletin Vol. 14 No. 3, page 726, August, 1971. According to this article, whenever a PLL or variable frequency clock oscillator (VFC) is dead tracked, the dead tracked VFC is then frequency synchronized to a tachometer associated with the tape transport. This action enables coarse synchronization of the VFC to the tape movement even though all of the VFCs may be dead tracked.

Another approach to ensuring reliable data recovery is the so-called common clock i.e., one phase lock loop or clock is used for all of the channels. Each of the channels have a phase adjustment for accommodating skew of the record member. Van Pelt, et al., U.S. Pat. No. 4,470,082 and Taber, et al., U.S. Pat. No. 4,433,424 show examples of such a common clock. One of the problems with the so called common clock is that it is expensive, requires high frequency circuits, and has questionable reliability. A much simpler technique of controlling the readback is desired.

SUMMARY OF THE INVENTION

It is an object that this invention provide a simple but effective control for a plurality of phase lock loops which enables each of the phase lock loops to independently control themselves, yet maintain an average frequency.

In accordance with the present invention, a plurality of phase lock loops have a common input connection to a reference capacitor. A relatively large-capacitance capacitor AC couples the reference capacitor to all of the phase lock loop or clocking circuits, one clocking circuit per track of the recording system. In this manner, all of the phase lock loops have an independent frequency control reference coupled to a common frequency reference derived from all of the phase lock loops.

In one aspect of the invention, the reference frequency source is a capacitor which would have a capacitance equal to a reference capacitance in each of the individual phase lock loops and AC coupling is provided by a capacitor having a relatively large capacitance such that it does not impact the frequency determination of the individual phase lock loops.

The foregoing and other objects, features and advantages of the invention will be apparent from the following more particular description of preferred embodiments of the invention, as illustrated in the accompanying drawing.

DESCRIPTION OF THE DRAWING

The sole figure is a combined block and circuit diagram illustrating the practice of the present invention in a magnetic tape environment.

DETAILED DESCRIPTION

Referring now to the drawing, a magnetic tape 10 is suitably transported past a multi-track transducer or head assembly 11. In a preferred construction, head 11 will have both recording and reading portions for each of the record tracks on tape 10. For example, in an 18 track tape, head 11 has 18 combinations of read gaps and write gaps. The interest of the present application relates to the frequency control of a reference clock used to read signals from magnetic tape 10. It is also to be understood that the details of the recorder for transporting tape 10 and mounting head 11 are not shown for purposes of brevity. There is one set of channels or readback circuits 12, 13, and 14 for each of the tracks on magnetic tape 10. The channel circuits provide data output over a set of lines 15 which are then phase synchronized for reconstructing the data, as is known. Each of the channel circuits has its own frequency determining portion 20,21,22 PLL for generating the reference clock signals. Portions 13 and 21 are represented by dots to indicate a plurality of the illustrated circuits 12, 14, 20 and 22. The portions 12, 14, 20 and 22 are brought out and expanded for illustrating the present invention. The signals sensed by the respective portions of head 11 for the respective tracks are processed by the channel circuits 12-14; phase comparator 16 compares the phase of the signal supplied by the respective oscillator VCO 30 with the phase of the head 11 read back signal. Charge pump 18 supplies a charge pump signal over line 25 to the input of PLL filter 20-22, respectively. Each charge pump signal is supplied through an RC circuit consisting of resistor 26, capacitor 27 and frequency determining capacitor 28 to a buffer amplifier 29 for controlling the frequency of operation of VCO 30. The frequency determining capacitor 28 is coupled to the ground reference potential. Generally, the capacitance value of capacitor 28 is somewhat larger then that of the capacitance of capacitor 27. The above design is known in the prior art.

In accordance with the invention, a single capacitor 40 having a capacitance for determining the frequency of operation of all VCO 30's is connected to all of the PLL filters 20, 21 and 22 of a system. The capacitors 28 now have a substantially larger capacitance than the capacitor 40, such as ten times the capacitance. In this manner, capacitor 40 is AC coupled to all of the PLL filters 20-22 to be DC isolated which enables the individual PLL filters 20-22 to compensate for any differences in VCO gains among the various phase-lock loops. The common capacitor 40 preferably has a capacitance determined by a multiplicative factor of the number of tracks, i.e. the number VCO's 30 being commonly referenced to this single capacitor 40. For example, for a nine track grouping, the capacitor 40 is nine times the capacitance of the prior art capacitor 28. In a group of eighteen PLL filters 20-22, the common capacitor 40 has eighteen times the capacitance of the frequency capacitor 28 of the prior art.

The arrangement shown in the sole Figure gives a global clock effect for all of the channels by coupling the frequency compensation portions of the PLL filters 20-22 together from each track through the coupling capacitors 28. The coupling capacitors 28 provide a DC or direct current blocking and respectively remain charged to the differences between the VCO gain for the respective tracks or channels; the average VCO gain of all of the tracks is coupled together through the common connection 41. Test operations of this circuit have shown that the individual channel circuits 12-14 are enabled to better recover data under marginal conditions for reducing the length of dropouts which then, of course, reduces dead tracking and enhances the recovery data integrity. While the magnetic tape 10 is being accelerated to operating speed, it has also been found that the frequency tracking of all of the PLLs for all of the tracks is enhanced by the illustrated configuration. An additional advantage of the present invention is that the phase lock loop bandwidth for the individual channel circuits 12-14 can be decreased for improving signal to noise performance. The technique of providing a frequency reference to all of the phase lock loops can be used with other filter topologies or circuit arrangements; from those illustrated in the drawing. The simplicity of the arrangement provides an enhanced operation without the attendant additional cost of a common clock or common VCO.

Each of the channel circuits 12, 13 and 14 includes a signal detection means 17 which receives the readback signal from head 11 and the clock signal over line 31 from a respective one of PLLs 20, 21 and 22. Detection means 17 (DETECT) includes the usual signal detection, error detection correction and other signal processing means found in such channel circuits. Compare (COMP) 16 compares the frequency and phase of the clock signal on line 31 with the readback signal received from head 11. A phase error signal (from charge pump 18) is supplied over line 25 in the usual manner for slaving the operation of VCO 30 to the signal received from head 11. As the quality of the readback signal changes, which can be caused by changes in the speed of tape 10 transport and the like, the VCO 30 may not faithfully follow the frequency and phase of the readback signal. Usually such degraded operation occurs in less than all of the channel circuits 12-14. Practice of the present invention improves accommodation of such signal quality variations.

While the invention has been particularly shown and described with reference to preferred embodiments thereof, it will be understood by those skilled in the art that various changes in form and details may be made therein without departing from the spirit and scope of the invention:

What is claimed is:

1. In a method of reading signals from a record member, wherein a plurality of tracks on the record member are substantially simultaneously synchronized for producing a like plurality of readback signals to be detected, the steps of:

supplying a plurality of phase lock loops each having a frequency determining portion and a frequency-phase control portion being operative with a respective one of said like plurality of readback signals for timing the detection thereof;

generating a clock signal in each of said phase lock loops for timing detection of each respective one of the plurality of readback signals to be detected and respectively phase and frequency comparing the generated clock signals with respective ones of the readback signals for generating a phase error signal respectively for changing the phase and frequency of the generated clock signals to be slaved to the respective-readback signals, AC coupling each of said frequency determining portions to a common frequency-determining electrical-capacitance means for generating an averaged phase error and frequency signal at said electrical-capacitance means and for supplying the averaged phase error and frequency signal to all of the frequency determining portions such that all of the phase lock loops generated said clock signals, respectively, at a same frequency; and detecting the data carried in the readback signals by comparing the readback signals with the clock signals, respectively, and separately indicating the data in the respective readback signals.

2. In the method set forth in claim 1 further including the step of:

supplying said frequency-determining electrical-capacitance means with an electrical capacitance equal to a product of an electrical capacitance value required to generate only one of said clock signals to have a frequency of said readback signal times a numerical value equal to said plurality of phase lock loops.

3. In the method set forth in claim 2 further including, the step of:

supplying a separate signal-coupling electrical capacitance for each of said ac coupling steps that has an electrical capacitance of an order of magnitude greater than the electrical capacitance of said supplied frequency determining electrical capacitance.

4. In a signal processing system, a method for timing the operation of a given plurality of phase lock loops, the steps of:
   supplying a single frequency-determining electrical capacitance for all of said given plurality of phase lock loops;
   separately and individually AC coupling said single frequency-determining electrical capacitance to a frequency determining portion in each of said given plurality of phase lock loops.

5. In the method set forth in claim 4, further including the steps of:
   in said ac coupling step, supplying a signal-coupling electrical capacitance for each of said frequency determining portions for AC coupling said frequency-determining electrical-capacitance to each of said frequency determining portions such that each of said frequency determining portions is not coupled to other ones of said frequency determining portions and each of said signal-coupling electrical capacitances has an electrical capacitance that is an order of magnitude greater than the electrical capacitance of the frequency-determining electrical capacitance.

6. In the method set forth in claim 4, further including the steps of:
   in said step of supplying the frequency-determining electrical capacitance, supplying the frequency-determining electrical capacitance to have an electrical capacitance having a value that is a product of a value equal to said given plurality multiplied by an electrical capacitance value required to individually operate each of said phase lock loops at a predetermined frequency of signal processing.

* * * * *